United States Patent [19]

Epstein

[11] 4,041,380
[45] Aug. 9, 1977

[54] MULTI-FUNCTION TESTER WITH REMOVABLE CIRCUIT CARTRIDGE

[75] Inventor: Harry Epstein, Seaford, N.Y.

[73] Assignee: Kastar, Inc., Belport, N.Y.

[21] Appl. No.: 666,710

[22] Filed: Mar. 12, 1976

[51] Int. Cl.² ................. G01R 31/02; G01R 1/06
[52] U.S. Cl. ................................. 324/51; 324/72.5
[58] Field of Search .............. 324/51, 53, 72.5, 133, 324/149

[56] References Cited

U.S. PATENT DOCUMENTS

| | | | |
|---|---|---|---|
| 1,696,266 | 12/1928 | Coote | 324/53 |
| 1,707,051 | 3/1929 | Colosoff | 324/72.5 UX |
| 1,888,906 | 11/1932 | Colosoff | 324/72.5 UX |
| 2,413,521 | 12/1946 | Roskilly | 324/53 |
| 2,540,402 | 2/1951 | Mosier | 324/53 |
| 2,547,248 | 4/1951 | Bartholomew | 324/72.5 UX |
| 3,196,217 | 7/1965 | Petrina | 324/72.5 X |
| 3,315,163 | 4/1967 | Lutz | 324/72.5 X |
| 3,704,411 | 11/1972 | Jamieson | 324/53 |
| 3,783,371 | 1/1974 | McMillan | 324/51 |

Primary Examiner—Gerard R. Strecker
Attorney, Agent, or Firm—Lackenbach, Lilling & Siegel

[57] ABSTRACT

A multi-function tester includes a hollow elongate cylindrical case having a longitudinal axis. A probe needle is fixedly mounted along the axis at one end of the case. A retractable protective sheath is provided which selectively covers and exposes the tip of the probe needle. A transparent cartridge containing electrical circuitry for performing a predetermined number of electrical tests is removably receivable within the case, with a penlite type battery being interposed between the cartridge and the probe needle. A compression spring is interposed between the battery conductive outer case and the probe needle. Electrical contacts connected to the circuitry within the cartridge are in electrical engagement with both the battery conductive outer case as well as to the center or positive terminal of the battery. An indexing arrangement is provided which is connected to another probe and is arranged to successively engage adjacent ones of a predetermined number of electrical contacts provided at the end of the cartridge proximate to the indexing arrangement. The cartridge is interchangeably receivable within the case to facilitate repair of the tester as well as to increase its versatility by permitting different tests or series of tests to be performed by different cartridges insertable into the same tester unit to thereby electrically connect different electrical elements to the tester probes. Lamps within the cartridge light up and provide a visual indication of test results through the transparent cartridge and a slot in the tester case.

19 Claims, 9 Drawing Figures

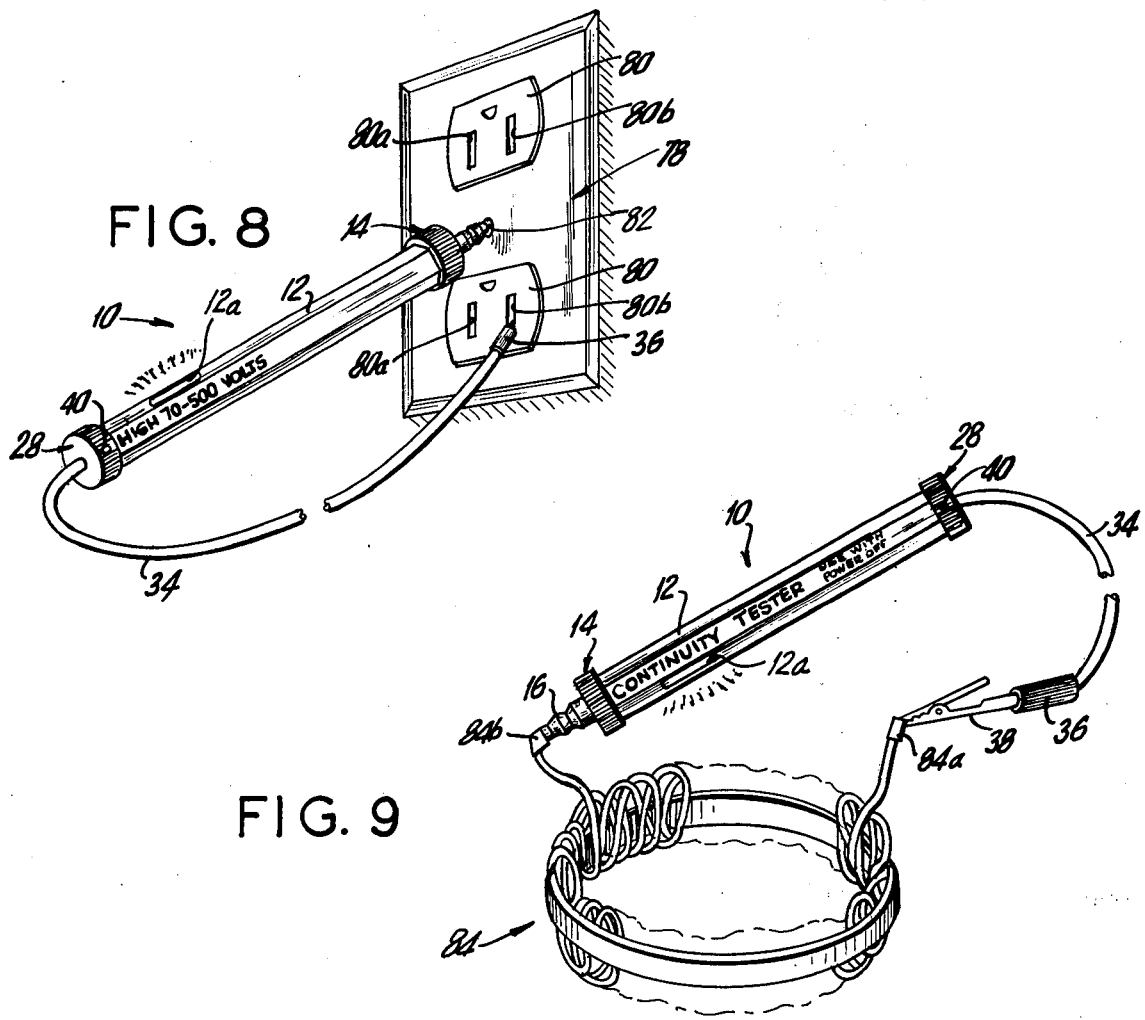

MULTI-FUNCTION TESTER WITH REMOVABLE CIRCUIT CARTRIDGE

BACKGROUND OF THE INVENTION

The present invention generally relates to multifunction testers for performing electrical tests, and more specifically to such a multi-function tester which includes removable and interchangeable cartridges or modules which contain electrical elements required to perform electrical tests, and which includes an indexing or a switching arrangement which is simple in construction and facilitates the selection of the tester function.

Numerous multi-position probes or testing devices for testing electrical circuits are known. Such probes are commonly used for servicing and repairing electronic equipment and involve the determination of electrical characteristics of electrical circuits. Common tests which are performed with such simple test instruments include the measurement of a voltage or resistance between two probes of the device or the current flowing through the two probes. The devices under discussion are frequently called multi-function devices or testers because they can perform two or more of the aforementioned tests by selecting the position of a switch which is provided on the probe or test unit. However, the multi-function testers known in the art have several important disadvantages. Firstly, some of these devices are complex in construction and, therefore, expensive to manufacture. Additionally, the electrical circuitry within the probe units is frequently permanently attached to the case or housing of the tester and may be inaccessible for purposes of repair or replacement.

Another disadvantage of the prior art devices is that they are limited to the two or more tests for which they are designed and their testing functions cannot be expanded once the test unit is assembled. An additional disadvantage of many prior art units is the difficulty or inconvenience with which the different functions are selected or changed during use of the device.

The above-described prior art devices are exemplified in U.S. Pat. Nos. 2,540,402; 3,196,217 and 3,315,163. In U.S. Pat. No. 2,540,402, for an electrical testing probe, there is shown a test unit which includes a rotatably mounted end knob. However, this knob only has the function of closing or opening a light circuit or energizing a bulb which lights the main or primary probe of the unit. The selection of the desired function in the patent under discussion is achieved by a series of jacks into which one of the probes is selectively inserted.

A multiple-position switch is disclosed in U.S. Pat. No. 3,196,217. This patent discloses a front or nose section which is rotatably mounted with respect to a rear barrel, with the relative position of the nose being selected by a resilient detent means. However, as suggested above, the components are mounted or connected directly to the rear barrel and, for this reason, are not conveniently accessible for repair or replacement. The meter probe with slidable circuit changing contact point of U.S. Pat. No. 3,315,163 has similar disadvantages. However, here the switch selector is a sliding member which has spring contacts for making successive engagements with various electrical contacts within the probe case. However, the last mentioned patent has a relatively complex construction and therefore is expensive to manufacture. None of the above-mentioned patents disclosed a multi-function tester which has a module or cartridge which contains electrical circuitry associated with the various tests to be performed, which cartridge or module is removably insertable into the tester case and may be conveniently and quickly changed to replace a defective cartridge or to change the functions or tests which are to be performed.

SUMMARY OF THE INVENTION

Accordingly, it is an object of the present invention to provide a multi-function tester which does not have the above-mentioned disadvantages associated with the prior art comparable testers.

It is another object of the present invention to provide a multi-function tester which is simple in construction and economical to manufacture.

It is still another object of the present invention to provide a multi-function tester of the type under discussion which includes cartridges or modules which contain electrical circuit elements associated with the various tests to be performed, which cartridges or modules can be removably received within the tester case.

It is yet another object of the present invention to provide a multi-function tester as in the last mentioned objects wherein a defective cartridge or module can be easily removed and replaced by a new module or cartridge.

It is a further object of the present invention to provide a multi-function tester as suggested in the last two mentioned objects, wherein the modules or cartridges are interchangeable to increase the versatility of the tester by permitting numerous test functions to be performed by insertion of suitable or corresponding cartridges.

It is still a further object of the present invention to provide a multi-function tester or the type suggested above which includes a novel indexing arrangement which cooperates with the cartridge or module within the tester, which indexing arrangement is simple in construction and convenient to use to permit changing of the functions of the tester with the minimum effort and with small probability of error.

In order to achieve the above objects, as well as others which will become readily apparent hereafter, a multi-function tester in accordance with the present invention comprises a substantially hollow case. First and second electrically conductive probes are associated with said case and a cartridge or module is provided which is removably receivable within said case. An electrical circuit is contained within said cartridge and includes a plurality of electrical elements a predetermined number of which are each associated with each test to be performed. A plurality of electrical contacts are provided on said cartridge which are connected to said electrical circuit, said first probe being electrically connected to one of said contacts when said cartridge is received within said case. A number of said electrical contacts corresponding to said perdetermined number being spaced from each other and connected to associated ones of said predetermined number of elements of said electrical circuit. Indexing means is provided which is mounted for movement relative to said case and said cartridge and has a conductive portion connected to said second probe and is successively engageable with different ones of said predetermined number of electrical contacts with movement of said indexing means relative to said case and said cartridge. In this manner, any one of a plurality of different tests can be performed by moving said indexing means to bring different electrical contacts into engagement with said conductive portion and thereby to electrically connect different electrical elements to said first and second probes.

BRIEF DESCRIPTION OF THE DRAWINGS

Further advantages and objects of the invention will become apparent from a reading of the following specification describing a presently preferred embodiment of the invention. The specification is to be taken with the accompanying drawings in which:

FIG. 7 is a perspective view of a fuse box, and the manner in which the multi-function tester of the present invention can be used on its low voltage setting to, for example, locate shorts in an automobile accessory protected by a burned out fuse;

FIG. 8 is a perspective view of a wall outlet, showing the manner in which the multi-function tester of the present invention can be used on its high voltage setting to test, for example, if the wires servicing the wall outlet are "hot"; and FIG. 9 is a perspective view of a motor coil, showing the manner in which the multi-function tester of the present invention can be used to measure shorts or breaks within a coil, for example, in the continuity setting or position of the indexing dial.

DESCRIPTION OF THE PREFERRED EMBODIMENT

Figure 1:
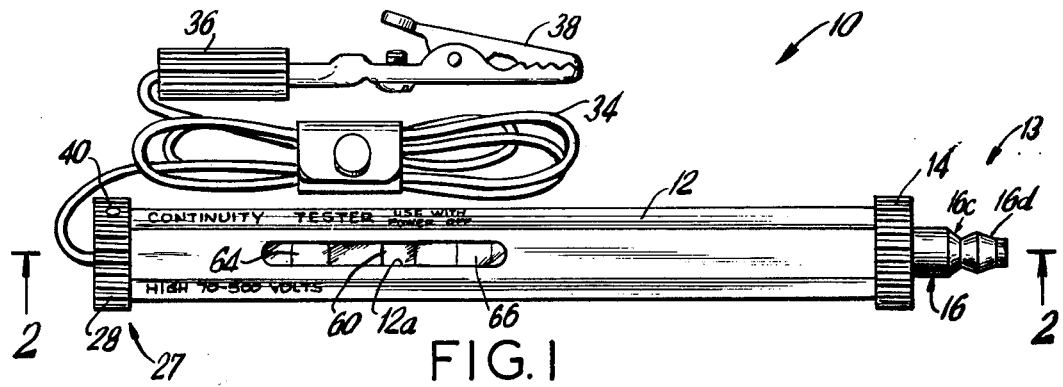
FIG. 1 is a side elevational view of a multi-function tester in accordance with the present invention, shown with the retractable protective sheath in the extended or covering position and with the indexing dial set for measuring continuity, the lamps associated with each of the tests to be performed being visible through a transparent cartridge in which the lamps are located and through a slot in the wall of the case of the tester.
Figure 2:
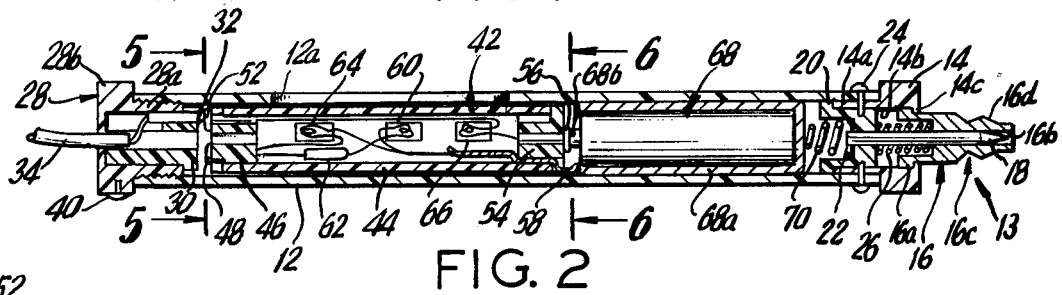
FIG. 2 is a cross-sectional view of the multi-function tester shown in FIGS. taken along line 2—2, this view showing the details of the construction of the tester and the manner in which a cartridge or module contained within the tester case cooperates with the indexing dial as well as with an internal battery and the remotely positioned probe needle.

Referring now specifically to the drawings, in which identical or similar parts are designated by the same reference numerals throughout, and first referring to FIGS. 1 and 2, the multi-function circuit and continuity tester in accordance with the present invention is generally designated by the reference numeral 10.

The tester 10 includes a substantially hollow case or barrel 12 which is elongate as shown and is substantially cylindrical and has a longitudinal axis or length direction. The case 12 may, for example, be formed of extruded stock and be made of any suitable plastic material.

When the case is cut to a suitable or convenient length, such as 5 or 6 inches, there are formed two open ends. For purposes of reference only, the end shown at the right hand side of the probe in FIGS. 1 and 2 will be referred to as the front end of the tester 10 while the opposite end will be referred to as the rear or back end. A pair of probes are provided as described below, each of which is associated with another one of the ends of the case 12.

A front probe, generally designated by the reference numeral 13, includes a front cap 14 which has a cylindrical portion 14a which is dimensioned to be received within the case 12 as shown. The front cap 14 has a cylindrical inner surface 14b which extends substantially the entire axial length of the front cap 14 but is provided with an inwardly directed annular flange or lip 14C at the frontmost end of the cylindrical inner surface 14b to form a stop which limits the forward motion of a retractable protective sleeve or sheath 16.

The protective sheath 16 includes an outwardly projecting annular flange 16a which is dimensioned to slidingly move along the cylindrical inner surface 14b but stopped by the annular flange 14c as shown in FIG. 2. The protective sleeve or sheath 16 has an exposed portion which extends beyond the front cap 14 and which has a substantially cylindrical external configuration. An annular groove 16c is formed on the exposed portion of the sheath 16, the configuration of the groove being selected to permit the end or tip of the sheath 16 to be snappingly received between a pair of opposing prongs of a fuse clip, as to be more fully described in connection with FIG. 7. The external annular groove 16c is disposed proximate the free end of the sheath 16 and advantageously has a V-shaped cross-sectional configuration. To facilitate insertion of the free end of the sheath 16 between the prongs of a fuse clip, the sheath 16 is advantageously provided with a tapered surface 16d between the free end of the sheath and the annular groove 16c.

The probe 13 further includes a probe needle 18 which is formed with a point at the front end thereof as shown in FIG. 2. A needle retainer 20 is provided which has dimensions closely corresponding to the internal dimensions of the case 12 to be received therein as shown. The probe needle 18 is advantageously press-fitted within an aperture of the needle retainer to position the probe needle along the axis of the case. For reasons to be described, there is also advantageously provided a washer or eyelet 22, the probe needle 18 extending slightly rearwardly with respect to the needle retainer 20 to be received in press-fitting relationship within the washer or eyelet 22. The mechanical connection thus formed between the probe needle 18 and the washer 22 provided electrical continuity between these two connected elements. Advantageously, at least a portion of the needle retainer 20 is received inside the cylindrical sleeve or wall 14a of the front cap 14 so that both the front cay 14 and the needle retainer 20 can be fixedly connected to the case 12 by means of nails or other suitable fasteners 24 which are driven through the wall of the case 12, the cylindrical wall 14a of the front cap 14 and the needle retainer 20. Two nails 24 are shown in FIG. 2 which are driven into these connected members at diammetrically opposing ends to more securely connect the same. The nails 24, therefore, fix the front cap 14, needle retainer 20 and probe needle 18 relative to the case 12.

The length of the probe needle 18 is selected so that at least the pointed or free end thereof extends beyond the front end of the case 12 or beyond the front cap 14. The protective sheath 16 is mounted for movement along the axis of the case 12 between a normal extended position shown in FIG. 2, wherein the sheath 16 covers the pointed or free end of the probe needle 18, in a retracted test position wherein the pointed or free end of the probe needle 18 is exposed and available to make electrical contact with a circuit to be tested. In order to maintain the sheath 16 in the normally extended or protective position, there is provided a helical compression spring 26 which is coaxially disposed with the probe needle 18 as shown and acts between the needle retainer 20 and a bearing surface of the protective sheath 16. In the normal extended position of the sheath 16, the helical spring 26 causes the sheath to move forwardly or towards the front of the tester 10. Engagement of the inwardly projecting annular flange 14c and the outwardly projecting annular flange 16a limits the frontward movement of the sheath 16 relative to the probe needle 18. To be fully effective, it is important that the protective sheath 16 fully cover or enclose the probe needle 18 in its normal extended position as shown when the flanges 14c and 16a are engaged or are in abutment against each other.

Excessive rearward movement of the sheath 16 is controlled by the needle retainer 20. As will be evident from FIG. 2, no further rearward movement is possible when the annular flange 16a of the sheath 16 abuts against the needle retainer 20. Therefore, the axial movement which is possible by the sheath 16 between the extended and retracted positions is equal to the axial distance between the needle retainer 20 and the annular flange 16a when the sheath 16 is in its extended position as shown in FIG. 2. This axial distance must be selected to be sufficiently large so that the free or pointed end of the probe needle 18 may be sufficiently exposed to perform desired tests, including, piercing electrical insulation with the pointed end of the probe needle 18 to make contact with electrical conductors.

Figure 3:
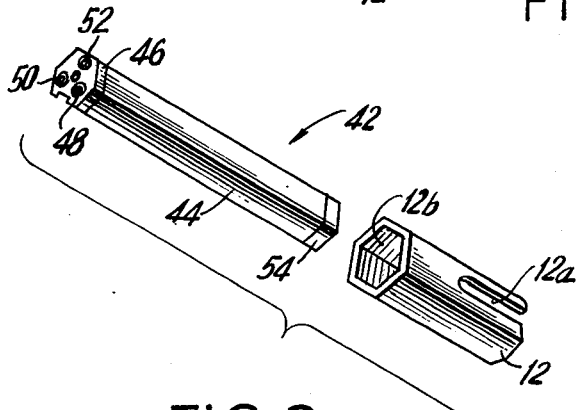
FIG. 3 is a fragmented exploded view of the cartridge or module and the tester case, showing the similarity between the external surface configuration of the cartridge of the cartridge and the internal surface configuration of the case which permits movement of the cartridge along the longitudinal direction of the case but prevents rotation of the cartridge relative to the case.

Provided at the other or the rearward end of the case 12, there is provided indexing means generally indicated by the reference numeral 27 in FIGS. 1 and 2. The indexing means or arrangement is, in the presently preferred embodiment, in the form of a rear end cap 28 which has an externally threaded cylindrical wall or sleeve 28a dimensioned to be received within the case 12 the external screw threads being selected to be threadedly engageable with internal screw threads 12a, best shown in FIG. 3. At the outer end of the rear cap 28 there is provided a portion of enlarged diameter 28b which is advantageously provided with a knurled, serrated or otherwise roughened external surface to facilitate gripping of the same between two fingers. As should be evident, gripping of the portion 28b and turning the same relative to the case 12 causes the rear cap 28 to rotate about an axis substantially coaxial with the axis of the case 12 and simultaneously causes axial movement of the rear cap 28 in one or the other axial direction depending upon the sense of rotation relative to the case.

Inserted within the cylindrical cavity formed by the annular wall 28a is a plug 30, the plug being press-fitted within the cylindrical cavity formed by the annular wall 28a so that rotation of the rear cap 28 about the axis of the case 12 causes simultaneous and like rotation of the plug 30 about that axis. A conductive portion or sliding contact 32 is mounted on the projects forwardly of the plug 30, the conductive portion being eccentrically offset with respect to the axis to move about a circular arc concentric with the axis when the rear cap 28 or indexing arrangement 27 is rotated.

A probe lead or wire 34 is connected to the conductive portion or sliding contact 32, the wire 34 being provided a sufficient length to perform most common tests. It has been found, for example, that a wire 34 and 24 inches is satisfactory for most purposes. The other end of the wire 34 is connected to probe 36 which has a conventional male connector which is receivable within a jack receptacle. An alligator clip 38 may also be provided which can be joined to the probe 36 as shown.

The rear cap 28 is additionally provided with an indexing or dial indicator 40 which may be in the nature of a pin driven into the enlarged portion 28b, the pin 40 serving as an indicia or marking of the relative position of the rear cap 28 relative to the case 12. As shown in FIGS. 1 and 7-9, the outer surface of the case 12 is provided with markings for each test which can be performed. The dial indicator or pin 40 and the markings are arranged to correspond with the desired position, the conductive portion 32 and to indicate the position of the same relative case 12.

An important feature of the present invention is the provision of a cartridge 42. The cartridge is formed of a generally elongate cylindrical case which is hollow. While the specific cross-sectional configurations of both the case 12 as well as the cartridge case 44 is not critical for achieving the objects of the present invention, the case 12 and cartridge 42 advantageously have substantially uniform and similar cross-sections, with the external surface of the cartridge case 44 corresponding to the internal surface of the case 12 to permit slidable movement of the cartridge 42 along the axis within the case 12. As shown in FIGS. 1, 3, 5 and 6, the case 12 and cartridge case 44 advantageously have similar regular polygonal cross-sections. In the presently preferred embodiment, the case 12 and the cartridge both have hexagonal cross-sections. As suggested in FIGS. 1 and 7-9, the exterior surface portions of the case or barrel 12 are provided with indicia or markings which designate the various tests which can be performed with the tester 10.

As with the case 12, the cartridge or module case 44 could be made from stock extruded from any suitable plastic material. When cut from a continuous cylindrical extruded section, the cartridge case 44 is formed with two open ends which are closed by plugs as will now be described.

Figure 5:
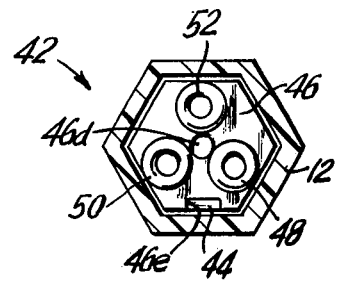
FIG. 5 is a cross-sectional view of the multi-function tester shown in FIG. 2, taken along line 5—5 to show the arrangement of electrical contacts on one end of the cartridge, which contacts cooperate with the indexing arrangement.

The end of the cartridge case 44 closest to the rear cap 28 is closed by a rear plug 46 which has a portion receivable in press-fitting relation inside the cartridge case 44 as shown. For this purpose, as best shown in FIG. 5, the rear plug 46 is provided with a cross-sectional configuration which corresponds to the cross-sectional shapes of the cartridge case 44 and case 12.

Figure 6:
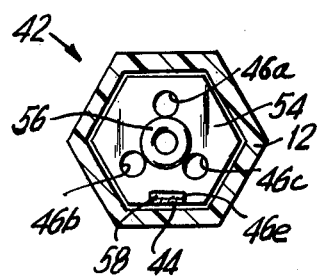
FIG. 6 is similar to FIG. 5, but taken along line 6—6 in FIG. 2 to show the arrangement of electrical contacts at the other or opposing end of the cartridge most remote from the indexing dial arrangement.

To facilitate assembly and reduce production costs, the rear plug 46 is similar in construction to the front plug 54 to be described. Referring to FIGS. 5 and 6, and for reasons which will become evident hereafter, each plug is formed with a plurality of spaced holes 46a–46c which are substantially uniformly spaced about a circular arc concentric with the axis of the cartridge case 44 and, therefore, the axis of the case 12. The plugs are also each provided with a hole 46d at or concentric with the axis of the cartridge case 44. The holes 46a–46d extend through the entire axial thickness of the plug 46 to provide through passages between the exterior and the interior of the cartridge 42.

Fixed contacts or eyelets 48, 50 and 52 are mounted on the rear plug 46 and extend through the aforementioned holes 46a–46c. Electrical contacts 48, 50 and 52 are thereby spaced from each other about a circular arc concentric with the axis of the cartridge 42 on the case 12. In this manner, with the electrically conductive portion or sliding contact 32 being eccentrically offset with respect to the axis a distance substantially equal to the radius of the circular arc about which the electrical contacts 48, 50 and 52 are spaced, the conductive portion 32 is successively engageable with adjacent ones of these electrical contacts upon rotation of the rear end cap 28 relative to the case 12 and the cartridge 42.

With the above-described arrangement, and when the cartridge 42 is initially inserted into the case 12 with a given relative angular orientation with respect to the case 12, the markings on the exterior surface of the case 12 bear a direct relation or correspond to the associated contacts 48, 50 and 52. The purpose of introducing the cartridge 42 into the case 12 with a given orientation is to cause the indexing dial indicator 40 and the markings on the case 12 to be arranged to correspond with the positions of the conductive portion 32 and the associated ones of the contacts 48, 50 and 52. In this manner, the test to be performed can be selected by dialing the end cap 28 to bring the dial indicator 40 opposite the corresponding markings on the case 12.

Referring to FIGS. 2 and 6, the opposite end of the cartridge 42 is provided with a front cap 54 which is provided with a fixed contact or eyelet 56 extending through the center hole 46d. The plugs 46 and 54 are also provided with a rectangular groove 46e in the nature of a rectangular channel extending axially along one of the edges thereof. The groove or channel 46e is dimensioned to pass a metallic spring contact 58 which has an exterior portion formed with an upwardly turned lip as best shown in FIG. 2 and has an internal portion which extends into the interior of the cartridge case 44. The front plug 54 is also maintained in press-fitting relationship within the cartridge case 44 as is the rear plug 46.

As is best shown in FIGS. 5 and 6, the plugs 46 and 54 are similar in construction with the exception that the rear plug 46 is provided with electrical contacts 48,50,52 through the holes 46a–46c while the front plug 54 is provided with electrical contacts 56,58 through the openings 46d and 46e. As will be evident to one skilled in the art, the specific arrangement of holes or openings through the plugs 46 and 54 as well as the positioning or nature of the electrical contacts which extend through such openings is not in and of itself critical for the purposes of achieving the objects of the present invention. The number of openings, the nature and arrangement of the electrical contacts described above are merely illustrative and a person skilled in the art could change any of the aforementioned without departing from the broad features and principles of the present invention.

Figure 4:
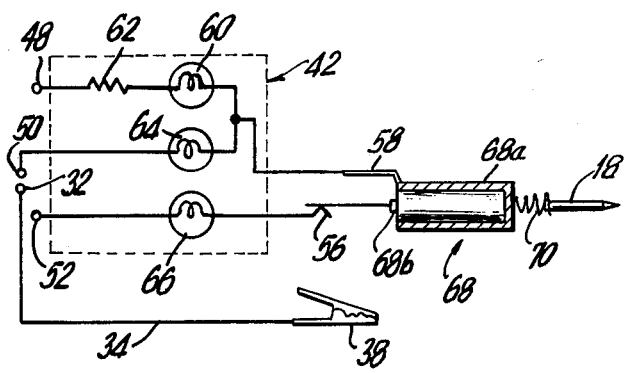
FIG. 4 is a schematic or electrical circuit of the multi-function tester shown in FIGS. 1 and 2, showing the manner in which the two end probes are connected to the various electrical elements within the cartridge which is received within the case.

Referring to FIGS. 2 and 4, an electrical circuit is contained or housed within the cartridge or module 42, the circuit including a plurality of electrical elements required to perform the tests or functions of the tester 10. The circuit includes a first circuit portion which extends between the fixed contacts 48 and the spring contacts 58, which circuit portion includes a neon or high-voltage lamp 60 and a series connected resistor 62. A low voltage lamp 64 extends between the spring contact 58 and the fixed contact 50 while a very low voltage lamp used for continuity test is connected between the fixed contact 52 and the fixed center contact 56. The operation of the tester and the manner in which the electrical elements within the cartridge 42 are used will be described hereafter. However, with the circuit of the presently preferred embodiment, the probe 10 can perform three basic types of functions, namely measure high voltage, measure low voltage and measure continuity. It is important, therefore, that the cartridge 42 and the circuit therein contain a predetermined number of electrical elements each of which is associated with each type of test which is to be performed. In the presently preferred embodiment, the number of electrical contacts on the rear plug 46 corresponds to the predetermined number of tests to be performed, namely three, and are connected to the electrical elements which are associated with those tests. This will be more fully described below.

The lamps 60, 64 and 66 form visual indicator means for providing an indication upon the occurrence of a predetermined test result. While these lamps form an inexpensive visual means for obtaining such results, it is clear that other indicators, including meters, audio indicators, and the like, can be used in place of the lamps to provide test results. However, where lamps are used, as in the presently preferred embodiment, the case 12 and the cartridge case 44 must both include means for permitting observation of the lamps therethrough. In the presently preferred embodiment, the cartridge case 44 is advantageously made from a transparent material such as a clear acrylic plastic. The case 12 may similarly be made from a transparent material. However, in the presently preferred embodiment, the case is shown to be provided with a slot 12a therein. Where the cartridge case 44 is made from an opaque material, it too can be provided with a suitable slot which must then be aligned with the slot 12a so that the lamps 60, 64 and 66 are visible through the two aligned slots.

As is well known to those skilled in the art, measurement of circuit continuity requires the provision of a source of electrical voltage. Where circuit continuity is to be one of the tests to be performed, as is the case with the tester 10, a penlite type battery 68 is provided which is inserted into the case 12 as shown. Where the outside diameter of the battery 68 corresponds to the inside diameter of the case 12, no additional means need be used to maintain the axial alignment of the battery 68. However, where the outer diameter of the battery 68 is smaller than the inside diameter of the case 12, any suitable cylindrical sleeve, made of cardboard, plastic or the like, may be used as a spacer and alignment member for maintaining the battery 68 aligned along the axis of the case 12.

The battery 68 is disposed within the case 12 between the cartridge 42 and the needle retainer 20. With this arrangement, the metallic or electrically conductive outer case of the battery 68a which forms the negative polarity terminal of the battery 68 is disposed for engagements with the spring contact 58 as best shown in FIG. 2. The positive or center terminal 68b of the battery is disposed to make contact with the center contact 56 on the cartridge 42.

While the axial length of the cartridge is not critical, it has been found that a suitable length is approximately 2¼ inches where the case 12 is approximately 5 inches in length. With this arrangement, the total axial lengths of the cartridge 42 and the battery 68 is less than the distance between the conductive portion 32 and the needle retainer 20 of the probe 13. There is accordingly provided an electrically conductive compression spring 70 which acts between the outer case 68a of the battery 68 and the washer or eyelet 22 which is in mechanical and electrical contact with the probe needle 18. The compression spring provides electrical continuity between the battery 68 and the probe needle 18 and simultaneously urges the cartridge 42 against the conductive portion or indexing sliding contact 32 to assure electrical contact between the conductive portion 32 and one of the predetermined number of contacts 48, 50 and 52 on the cartridge 42. As suggested above, the rear cap 28 is threadedly mounted at the rear or back end of the case 12 for rotation about the axis thereof to bring the conductive portion 32 into successive engagement with different ones of the contacts 48, 50 and 52. The spring 70 also serves the additional function of urging the cartridge into pressure abutment against the conductive portion and for causing the cartridge 42 to follow the rear cap 28 with axial movements thereof during rotation. In this manner, contact is always insured between the conductive portion 32 and one of the electrical contacts 48, 50 and 52 on the cartridge 42 independently of the relative angular position of the rear cap or the test selector setting.

The battery 68 is only required for continuity tests and it is only for that test that the battery is interposed between the probe needle 18 and the conductive portion 32. In order to bypass the battery 68 for the other tests while still providing electrical continuity between the probe needle 18 and the conductive portion 32, the outer or conductive case of the battery 68 is used an an electrical conductor. As suggested above, one of the electrical contacts provided on the cartridge 42 is in the nature of a spring contact 58 which is disposed proximate to the wall of the cartridge or module case 44 so that the spring contact abuts against the battery case 68a when the battery 68 is urged against the cartridge or modules 42 by the spring 70. Circuit continuity is established between the probe needle 18 and the circuitry within the module 42 by way of the conductive washer or eyelet 22, the conductive compression spring 70, the conductive battery outer case 68a and the spring contact 58. This mode of conduction is used for low and high voltage tests wherein the conductive portion 32 is connected to either the contact 48 or the contact 50, wherein the associated electrical elements 60, 62 and 64 are connected to the spring contact 58.

The materials out of which the plugs 46 and 54 are made are not critical and the same is true for the end caps 14 and 28. However, it has been found that nylon is a satisfactory material for the rear plug 46 and the front plug 54, although styrene, polypropylene, ABS and Butyrate are also acceptable. The end caps 14 and 28 may similarly be made from any suitable material, such as a plastic material, and it has been found that high impact styrene is satisfactory for this purpose.

As above described, the multi-function circuit and continuity tester 10 can be utilized to perform numerous functions and tests on electrical circuits. With the cartridge 42 as described and shown in the FIGS. 2 and 4, three different types of basic tests can be performed. These three basic tests are measurement of low voltage, high voltage and circuit continuity. To this end, the exterior surface of the case 12 may be suitably marked, by way of example only, as follows: "Low 12–40 volts"; "High 70–500 volts"; and "Continuity". An additional marking "Use With Power Off" is advantageously used proximate the "Continuity" marking for reasons which are self-evident to those skilled in the art. With the contacts 48, 50 and 52 spaced on a circular arc 120° apart, the markings on the case 12 may be placed on alternate planar surface portions of the hexagonally shaped case 12.

With the multi-function circuit and continuity tester 10 as described above and shown in the FIGURES, the test or function which is to be performed or the circuit portion or lamp which is "enabled" is determined by the relative angular position of the indexing rear end cap 28. Selection or changing of the functions of easily and conveniently achieved by turning the rear end cap 28 as described above to bring the sliding contact 32 into abutment with one of the contacts 48, 50 and 52 by aligning the pin or dial indicator 40 with one of the marked surfaces of the case 12.

The use of removable and interchangeable cartridges or modules 42 as described above, which encloses or houses electrical circuit elements of a test circuit, has numerous advantages not heretofore achievable with prior art test units. Firstly, by removing the rear cap 28, the cartridge or module 42 can be easily removed for replacement of a defective module. Additionally, while three circuit portions connected to three respective contacts 48, 50 and 52 have been disclosed, it is possible that more or less circuit portion and fixed contacts be provided on the rear plug 46. Thus, if only one test is to be performed, it is possible that the cartridge 42 only contain one circuit portion described above. More specifically, if the module 42 is only to be functional to provide a continuity test, then it need only contain the lamp 66 and be provided with the contacts 52 and 56. Where only low voltges are to be measured, only the lamp 64, and contacts 50 and 58 need be provided. The circuit portion including the lamp 60, resistor 62 and the contacts 48 and 58 only need be provided if only high voltages are to be measured. A rotatably mounted indexing means 27 is, clearly, only required to select between two or more contacts on the rear plug 46. Where each module 42 contains only the electrical means for performing a single test, a fixed rear cap 48 may be provided.

When the cartridges or modules 42 are each adapted to perform only a limited number of test functions, these can be interchanged with modules containing the means for performing other test functions. The cartridge 42 may be provided with circuitry as simple or sophisticated as may be necessary to perform various tests, including tests to measure impedance, frequency, capacitance and the like. By permitting these cartridges to be interchanged, the versatility of flexibility of the continuity tester 10 is substantially increased. Thus, whereas most known probe testers perform only a small or limited number of tests, the tester in accordance with the present invention is adapted to perform many more tests by insertion of appropriate modules.

The operation of the tester 10 will now be described, to the extent to which it has not been described above. Making reference to FIGS. 7-9, some typical tests which can be performed with the tester are shown. These tests are only by way of example and are not limiting of the numerous types of tests which can be performed with the device. In FIG. 7, the pin or dial indicator 40 is shown aligned with the "Low 12-40 volts" marking on the case 12. This position is suitable for testing voltages in the range between approximately 12 and 40 volts in car and home circuits. With this setting, the tester 10 can be used to locate short circuits in accessories or appliances protected by fuse boxes. In FIG. 7, a fuse box 72 is shown which includes fuse clips 74 formed by opposing prongs. To locate a short circuit, the "burned out" fuse is removed from the fuse box 72 and the protective sleeve or sheath 16 is inserted or snapped into one of the fuse clips as shown. The alligator clip 38 is attached to the other fuse clip as shown. All the accessories protected by the burned out fuse are turned on. Turning the power on, such as turning the ignition switch of the automobile on to "accessory on" position, the tester will light and will remain lit until the "shorted" circuit is disconnected. This test is suitable for locating short circuits in automobile radios, clocks, wires, etc. FIG. 8 illustrates one example in which the tester 10 can be used on a "High 70-500 volts" setting. Here, a wall outlet 78 is shown which includes two receptacles 80 each provided with openings 80a and 80b through which a plug may be inserted. One of the electrical contacts in the openings 80a and 80b of each receptacle 80 is a "hot" contact while the other is a "grounded" contact. A screw 82 for the wall outlet plate is at the ground potential since it is mechanically in contact with the box in which the wall outlet 78 is mounted. To test the wall outlet 78, the probe 36 is inserted into one of the openings of the outlet 78. It is important to make certain that the probe 36 is inserted fully so that it engages the electrical contacts within the receptacles 80. The other probe, namely the sheath 16, is brought into contact with the screw 82 of the outlet plate. If the circuit is "live" or "hot", the tester 10 will light up. Both sides of the outlet must be tested, as suggested above, since only one side is "hot" on 110 volts AC circuits.

In FIG. 10, a simple continuity test is shown, wherein a motor coil is tested for continuity. After dismantling the motor, the individual motor winding 84 may be checked for shorts and breaks. The alligator clip 38 is attached to one end of the coil 84a while the pointed tip of the tester or protective sheath 16 is attached to the other end 84b. If the tester lights, the coil is good. A "shorted" or "grounded" coil may be checked by attaching the alligator clip 36 to one end of the coil winding and pressing the protective sheath 16 against the metal housing of the motor. If the tester lights up, the coil is "grounded" to the metal frame.

The provision of the retractable sheath 16 is particularly important where the probe needle 18 must be brought into contact with an electrical conductor covered by an insulation layer. This is the case, for example, when spark plugs of an automobile are tested. With the tester set to "high voltage" position, the engine is started and permitted to idle. The alligator clip 38 is attached to any metal surface and the retractable sheath 16 is pressed against the insulated booth of the spark plug wire with sufficient force to cause the retractable sheath 16 to move rearwardly with respect to the probe needle 18, the exposed needle 18 being urged through the insulated both to touch the spark plug metal terminal. If the plug is good, the engine will misfire and idle more roughly.

The high voltage setting of the tester 10 can also be utilized to test wall switches, condensers, fuses as well as numerous other tests which will readily come to mind to one skilled in the art. The "low 12-40 volts" setting can be used, by way of example only, to perform the following tests in addition to those described above: to time an internal combustion engine, to test a thermostat, to test the wiring system of an automobile, including testing the fuses, test for live wires, find breaks in wires, to test light sockets and to test spark plug wires and distributor caps. The "Continuity" setting can be used to test fuses, bulbs, chimes, switches and appliances generally. This setting can also be used to test diodes and other semi-conductive devices, as will be readily evident to one skilled in the art.

It is to be understood that the foregoing description of the presently preferred embodiment illustrated herein is exemplary only, and various modifications to the embodiment shown herein may be made without departing from the spirit and scope of the invention.

What is claimed is:

1. A multi-function tester comprising a substantially hollow case; first and second electrically conductive probes associated with said case; a cartridge removably receivable within said case; electrical circuit means contained within said cartridge for performing a predetermined number of tests; a plurality of electrical contacts on said cartridge connected to said electrical circuit means, said first probe being electrically connected to one of said contacts when said cartridge is received within said case, the number of said electrical contacts corresponding to said predetermined number of tests and being spaced from each other; and indexing means mounted for movement relative to said case and said cartridge and having a conductive portion connected to said second probe and being successively engageable with different ones of said predetermined number of electrical contacts with movement of said indexing means relative to said case and said cartridge, whereby any one of a plurality of different tests can be performed by moving said indexing means to bring different electrical contacts into engagement with said conductive portion and thereby to electrically connect different electrical contacts to said first and second probes.

2. A multi-function tester as defined in claim 1, wherein said case is elongate and substantially cylindrical and has a longitudinal axis.

3. A multi-function tester as defined in claim 2, wherein said case and cartridge have substantially uniform and similar cross-sections, with the external surface of said cartridge corresponding to the internal surface of said case to permit slidable movements of said cartridge along said axis within said case, each of said probes being disposed at another or the opposite ends of said case.

4. A multi-function tester as defined in claim 3, wherein said first probe comprises a probe needle; and further comprising a needle retainer fixedly connected to one end of said case which fixes the position of said needle probe relative to said case with said needle probe extending beyond said one end of said case.

5. A multi-function tester as defined in claim 4, wherein said needle probe is positioned along said axis; and further comprising a retractable protective sheath resiliently mounted for movement along said axis between a normal extended position and a retracted test position, the outermost tip of said needle probe being covered in the extended position and being exposed in the retracted position of said sheath.

6. A multi-function tester as defined in claim 5, wherein said sheath has an exposed portion extending beyond said one end of said case, said exposed portion of said sheath having a substantially cylindrical external configuration and having an external annular groove proximate to the free end thereof, the diameter of said sheath and the configuration of said annular groove being selected to permit said free end of said sheath to be snappingly received between a pair of opposing prongs of a fuse clip.

7. A multi-function tester as defined in claim 6, wherein said annular groove has a V-shaped configuration.

8. A multi-function tester as defined in claim 6, wherein said sheath is tapered between the free end thereof and said annular groove to facilitate insertion of said free end between the prongs of the fuse clip.

9. A multi-function tester as defined in claim 8, wherein one of the tests performed by the tester is circuit continuity, and further comprising a battery receivable within said case between said cartridge and said first probe, said battery having a terminal of one polarity engageable with said one of said contacts and a terminal of opposite polarity engageable with said first probe.

10. A multi-function tester as defined in claim 9, wherein the total axial lengths of said cartridge and said battery is less than the distance between said conductive portion and said first probe, and further comprising an electrically conductive compression spring acting between said terminal of opposite polarity and said first probe, said compression spring providing electrical continuity between said battery and said first probe and simultaneously urging said cartridge against said conductive portion to assure electrical contact between said conductive portion and one of said predetermined number of contacts on said cartridge.

11. A multi-function tester as defined in claim 9, wherein said terminal of opposite polarity comprises the outer case of said battery, one of said plurality of electrical contacts comprising a spring contact engageble with one end of said battery outer case; and further comprising an electrically conductive compression spring acting between the other end of said battery outer case and said first probe, whereby said outer case and said compression spring serve as electrically conductive paths between said cartridge and said first probe.

12. A multi-function tester as defined in claim 2, wherein said case and cartridge have similar regular polygonal cross-sections.

13. A multi-function tester as defined in claim 3, wherein said case and cartridge have hexagonal cross-sections.

14. A multi-function tester as defined in claim 2, wherein said predetermined number of electrical contacts are spaced from each other about a circular arc concentric with said axis on the end of said cartridge proximate to said indexing means, said indexing means being mounted at one end of said case for rotation about said axis, said electrically conductive portion being eccentrically offset with respect to said axis a distance substantially equal to the radius of said circular arc, whereby said conductive portion is successively engageable with adjacent ones of said predetermined number of electrical contacts upon rotation of said indexing means relative to said case and said cartridge.

15. A multi-function tester as defined in claim 3, wherein said circuit means includes visual indicator means for providing an indication upon the occurrence of a predetermined test result, said case and cartridge both including means for permitting observation of said indication therethrough.

16. A multi-function tester as defined in claim 15, wherein said indicator means comprises a lamp, and said cartridge is formed of a transparent material.

17. A multi-function tester as defined in claim 16, wherein said case is provided with a slot therein, wherein lighting of the lamp is observable through said transparent cartridge and said slot.

18. A multi-function tester as defined in claim 2, wherein said indexing means is in the nature of an end cap threadedly mounted at one end of said case for rotation about said axis to bring said conductive portion into successive engagement with different ones of said predetermined number of contacts; and resilient biasing means within said case for urging said cartridge into pressure abutment against said indexing means and for causing said cartridge to follow said end cap with axial movements thereof during rotation.

19. A multi-function tester as defined in claim 18, wherein said end cap has a dial indicator, said case outer surface is provided with markings for each test which is to be performed, said dial indicator and markings being arranged to correspond with the positions of said conductive portion and the associated ones of said predetermined number of contacts, whereby the test to be performed can be selected by dialling said end cap to bring said dial indicator opposite the corresponding marking on said case.

* * * * *